(12) United States Patent
Yatskov

(10) Patent No.: US 7,304,842 B2
(45) Date of Patent: Dec. 4, 2007

(54) APPARATUSES AND METHODS FOR COOLING ELECTRONIC DEVICES IN COMPUTER SYSTEMS

(75) Inventor: Alexander I. Yatskov, Seattle, WA (US)

(73) Assignee: Cray Inc., Seattle, WA (US)

( * ) Notice: Subject to any disclaimer, the term of this patent is extended or adjusted under 35 U.S.C. 154(b) by 0 days.

(21) Appl. No.: 11/153,847

(22) Filed: Jun. 14, 2005

(65) Prior Publication Data
US 2005/0286230 A1 Dec. 29, 2005

Related U.S. Application Data

(60) Provisional application No. 60/579,401, filed on Jun. 14, 2004.

(51) Int. Cl.
*H05K 7/20* (2006.01)
(52) U.S. Cl. .................. 361/687; 165/80.3; 361/697
(58) Field of Classification Search ........ 361/687–704, 361/709–712, 717–720; 165/80.3
See application file for complete search history.

(56) References Cited

U.S. PATENT DOCUMENTS

| | | |
|---|---|---|
| 3,317,798 A | 5/1967 | Chu et al. |
| 4,315,300 A | 2/1982 | Parmerlee et al. |
| 4,993,482 A | 2/1991 | Dolbear et al. |
| 5,035,628 A | 7/1991 | Casciotti et al. |
| 5,150,277 A | 9/1992 | Bainbridge et al. |
| 5,161,087 A | 11/1992 | Frankeny et al. |
| 5,273,438 A | 12/1993 | Bradley |
| 5,323,847 A | 6/1994 | Koizumi et al. |
| 5,329,425 A * | 7/1994 | Leyssens et al. ........... 361/701 |
| 5,339,214 A | 8/1994 | Nelson |

(Continued)

FOREIGN PATENT DOCUMENTS

EP 1665916 3/2005

(Continued)

OTHER PUBLICATIONS

Vogel, Martin et al., "Low Profile Heat Sink Cooling Technologies for Next Generation CPU Thermal Designs," *Electronic Cooling Online*, 2002-2005, 11 pages.

(Continued)

*Primary Examiner*—Jayprakash Gandhi
*Assistant Examiner*—Ingrid Wright
(74) *Attorney, Agent, or Firm*—Perkins Coie LLP

(57) ABSTRACT

Apparatuses and methods for cooling processors and other electronic components in computers and other systems are disclosed herein. A heat sink configured in accordance with one embodiment of the invention includes a heat pipe structure. The heat pipe structure includes an interface portion offset from a body portion by a leg portion. The interface portion is configured to be positioned proximate to a processor or other electronic device, and the body portion is configured to be spaced apart from the electronic device. The heat pipe structure further includes a working fluid. The working fluid is positioned to absorb heat from the electronic device at the interface portion of the heat pipe structure and transfer the heat to the body portion of the heat pipe structure. In one embodiment, the heat sink can further include a plurality of cooling fins attached to the body portion of the heat pipe structure.

23 Claims, 9 Drawing Sheets

U.S. PATENT DOCUMENTS

| | | |
|---|---|---|
| 5,365,402 A | 11/1994 | Hatada et al. |
| 5,376,008 A | 12/1994 | Rodriguez |
| 5,395,251 A | 3/1995 | Rodriguez et al. |
| 5,402,313 A | 3/1995 | Casperson et al. |
| 5,410,448 A | 4/1995 | Barker, III et al. |
| 6,046,908 A | 4/2000 | Feng |
| 6,115,242 A | 9/2000 | Lambrecht |
| 6,158,502 A | 12/2000 | Thomas |
| 6,167,948 B1 | 1/2001 | Thomas |
| 6,310,773 B1 | 10/2001 | Yusuf et al. |
| 6,332,946 B1 | 12/2001 | Emmett et al. |
| 6,416,330 B1 | 7/2002 | Yatskov |
| 6,435,266 B1 | 8/2002 | Wu |
| 6,515,862 B1 | 2/2003 | Wong et al. |
| 6,519,955 B2 * | 2/2003 | Marsala ............... 62/119 |
| 6,550,530 B1 * | 4/2003 | Bilski ............... 165/104.26 |
| 6,564,858 B1 | 5/2003 | Stahl |
| 6,644,384 B2 | 11/2003 | Stahl |
| 6,661,660 B2 * | 12/2003 | Prasher et al. ............ 361/700 |
| 6,679,081 B2 | 1/2004 | Marsala |
| 6,772,604 B2 | 8/2004 | Bash et al. |
| 6,914,780 B1 * | 7/2005 | Shanker et al. ............ 361/687 |
| 6,975,510 B1 | 12/2005 | Robbins et al. |
| 6,992,889 B1 | 1/2006 | Kashiwagi et al. |
| 6,997,245 B2 * | 2/2006 | Lindemuth et al. .... 165/104.26 |
| 6,999,316 B2 * | 2/2006 | Hamman ............... 361/701 |
| 2001/0052412 A1 | 12/2001 | Tikka |
| 2002/0181200 A1 | 12/2002 | Chang |
| 2003/0056941 A1 | 3/2003 | Lai et al. |
| 2004/0008491 A1 | 1/2004 | Chen |
| 2004/0052052 A1 | 3/2004 | Rivera |
| 2005/0120737 A1 | 6/2005 | Borror et al. |
| 2005/0162834 A1 | 7/2005 | Nishimura |
| 2005/0168945 A1 | 8/2005 | Coglitore |
| 2005/0241810 A1 | 11/2005 | Malone et al. |

FOREIGN PATENT DOCUMENTS

| | | |
|---|---|---|
| JP | 2004-079754 | 8/2002 |

OTHER PUBLICATIONS

Webb, Warren, "Take the heat: Cool that hot embedded design," *EDN*, May 13, 2004, 5 pages.

"Heat Spreaders," Novel Concepts, Inc., http://www.novelconceptsinc.com/heat-spreaders.htm, accessed Jun. 14, 2005, 3 pages.

"Therma-base™ Heat Sink," Thermacore, http://www.thermacore.com/thermabase.htm, accessed Jun. 14, 2005, 3 pages.

Baer, D.B., "Emerging Cooling Requirements & Systems in Telecommunications Spaces," Telecommunications Energy Conference 2001, Oct. 14-18, 2001, pp. 95-100.

"Frequently Asked Questions about Heat Pipes," Thermacore International, Inc., http://www.thermacore.com/hpt_faqs.htm, 3 pages [accessed Jun. 14, 2004].

Hannemann, Robert et al., "Pumped Liquid Multiphase Cooling," ASME, 2004, IMECE 2004, Paper IMECE2004-60669, Anaheim, CA, 5 pages.

"Heat Spreaders," Novel Concepts, Inc., http://www.novelconceptsinc.com/heat-spreaders.htm, 2 pages [accessed Jun. 14, 2004].

JAMSTEC/Earth Simulator Center, "Processor Node (PN) Cabinet," one page http://www.es.jamstec.go.jp/esc/eng/Hardware/pnc.html [accessed Mar. 5, 2004].

Pitasi, M. "Thermal Management System Using Pumped Liquid R-134a with Two Phase Heat Transfer," Thermal Form & Function LLC, Manchester, MA, http:/www.coolingzone.com/Guest/News/NL_MAR_2002/TFF/Tff.html, pp. 1-9, Mar. 2002.

\* cited by examiner

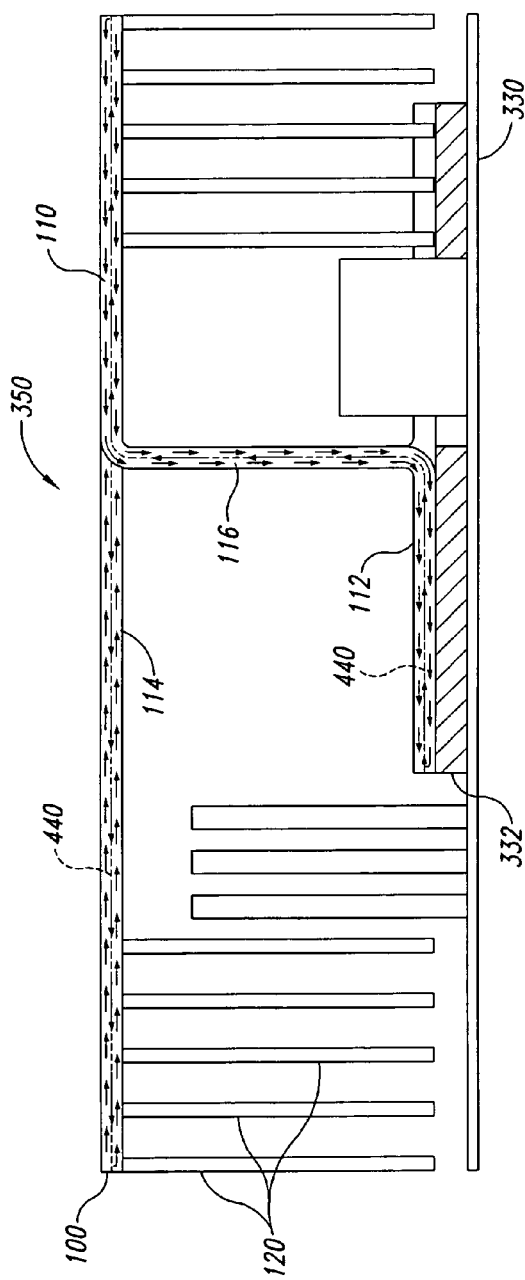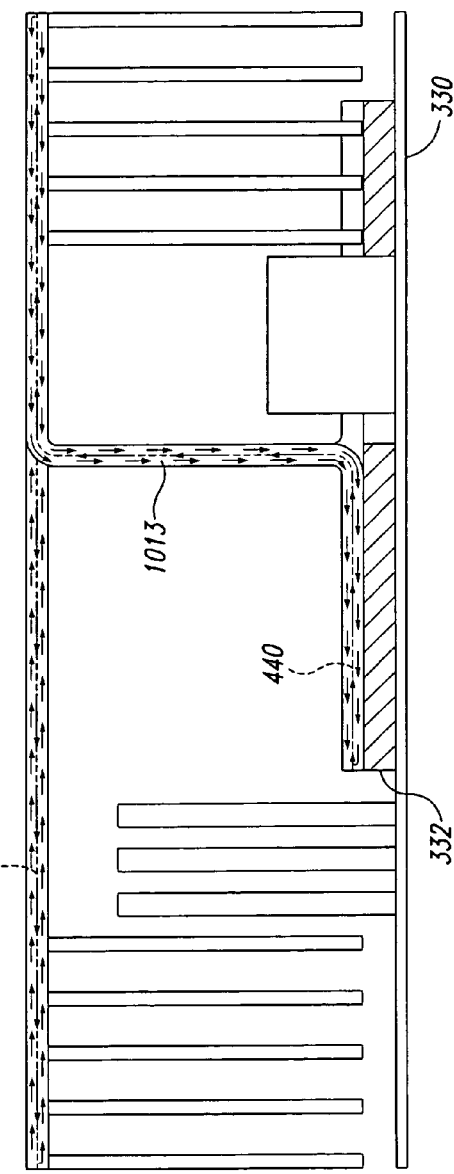

APPARATUSES AND METHODS FOR COOLING ELECTRONIC DEVICES IN COMPUTER SYSTEMS

CROSS-REFERENCE TO RELATED APPLICATION(S) INCORPORATED BY REFERENCE

This application claims the benefit of U.S. Provisional Application No. 60/579,401, filed on Jun. 14, 2004, entitled "METHODS AND APPARATUSES FOR COOLING ELECTRONIC DEVICES IN COMPUTER SYSTEMS," which is incorporated herein in its entirety by reference.

TECHNICAL FIELD

The following disclosure relates generally to apparatuses for cooling electronic devices in computer systems and, more particularly, to heat pipe systems for cooling electronic devices mounted to computer modules in large computer systems.

BACKGROUND

Supercomputers and other large computer systems typically include a large number of computer cabinets arranged in banks. Each of the computer cabinets typically holds a large number of computer modules positioned in close proximity to each other for high efficiency. Each of the computer modules can include a motherboard having a printed circuit or printed wiring assembly (PWA) electrically connecting a plurality of processors, routers, and other microelectronic devices together for data and/or power transmission.

Many of the electronic devices typically found in supercomputers, such as fast processing devices, generate considerable heat during operation. This heat can damage the device and/or degrade performance if not dissipated. Consequently, supercomputers typically include both active and passive cooling systems to maintain device temperatures at acceptable levels.

Various types of passive heat-dissipation devices, such as heat sinks and heat pipe systems, have been used to cool processors and other types of electronic devices typically found in computer systems. Conventional heat sinks typically include a plurality of cooling fins extending upwardly from a planar base structure. In operation, the planar base structure is held in contact with the electronic device and heat from the device transfers into the base and then the cooling fins. Air from a cooling fan or similar device can be directed over the cooling fins to dissipate the heat.

One problem associated with conventional heat sinks is that the heat generated by the electronic device tends to be localized in discrete areas. This leads to high thermal gradients across the heat sink. As a result, most of the heat is dissipated by the cooling fins located close to the hot regions of the device. Another shortcoming of conventional heat sinks is that the air flow rate through the cooling fins is often less than the flow rate around the heat sink—an effect commonly referred to as "overpass" or "sidepass."

Heat-dissipation devices based on heat pipe technology typically operate on a closed, two-phase cycle that utilizes the latent heat of vaporization to transfer heat. One conventional heat pipe system for cooling processing devices includes a planar base consisting of a porous wick structure. The porous wick structure forms an envelope that is evacuated and backfilled with just enough working fluid to saturate the wick structure. The pressure inside the envelope is set near the equilibrium pressure for liquid and vapor.

In operation, the base of the heat pipe system is held in contact with the electronic device, and heat from the device causes the local working fluid to evaporate at a pressure that is slightly higher than the equilibrium pressure. The high pressure vapor then flows away from the heat source to a cooler region of the base structure where the vapor condenses, giving up its latent heat of vaporization. The condensed fluid then moves back to the hot region of the base structure by capillary forces developed in the wick structure. This continuous cycle transfers large quantities of heat across the base structure with low thermal gradients. Like the heat sink described above, the heat pipe system can also include a plurality of cooling fins extending upwardly from the base structure to dissipate heat into a cooling air flow.

Another heat-pipe-based system that has been disclosed for cooling semiconductors is the heat spreading apparatus described in U.S. Pat. Nos. 6,158,502 and 6,167,948 to Thomas, both of which are incorporated herein in their entireties by reference. The heat spreading apparatus of Thomas includes a first planar body connected to a second planar body to define a void therebetween. The void includes a planar capillary path and a non-capillary region. The heat spreading apparatus dissipates heat by vaporizing a portion of working fluid in a hot region of the planar capillary path, condensing the fluid in a cool area of the non-capillary region, and moving the condensed fluid from the cool area of the non-capillary region to the hot region of the planar capillary path through capillarity.

The various heat pipe systems described above typically operate with lower thermal gradients than conventional, non-heat-pipe-based heat sinks. However, the efficiency of these systems is still limited by space constraints, air flow constraints, and/or other factors when used in large computer systems and other high density applications.

BRIEF DESCRIPTION OF THE DRAWINGS

FIG. 4 is a cross-sectional elevation view showing a portion of the heat sink of FIG. 3 mounted to the motherboard.

FIG. 10 is a cross-sectional view showing a portion of a heat sink that includes a convection driven siphon configured in accordance with an embodiment of the invention.

DETAILED DESCRIPTION

The following disclosure describes several embodiments of apparatuses and methods for cooling electronic devices mounted to motherboards and other structures. An apparatus for dissipating heat generated by a processor or other electronic device in accordance with one aspect of the invention includes a heat pipe structure. The heat pipe structure includes an interface portion offset from a body portion by a leg portion. The interface portion is configured to be positioned proximate to an electronic device, and the body portion is configured to be spaced apart from the electronic device. The heat pipe structure further includes a working fluid. The working fluid is positioned to absorb heat from the electronic device at the interface portion of the heat pipe structure and transfer the heat to the body portion of the heat pipe structure. In another aspect of the invention, the apparatus can further include at least one cooling fin attached to the body portion of the heat pipe structure. In this way, heat can be transferred away from the electronic device and dissipated by air flowing over the cooling fin.

A heat sink configured in accordance with another aspect of the invention is configured to spread the heat generated by an electronic device over a broader area than conventional heat sinks. Specifically, in this aspect of the invention, the heat sink can extend beyond the electronic device and over an adjacent portion of the motherboard or other mounting structure. In addition, the heat sink can include cooling fins that extend into gaps between other components mounted to the motherboard. This enables the heat sink to take advantage of relatively high velocity/low temperature air flows that may exist away from the electronic device.

Specific details of several embodiments of the invention are described below to provide a thorough understanding of such embodiments. Other details describing well-known structures and systems often associated with computers and related devices are not set forth below to avoid unnecessarily obscuring the description of the various embodiments. Those of ordinary skill in the art will understand that the invention may have other embodiments in addition to those described below with reference to the related Figures. Such embodiments may include elements other than those described below. In addition or alternatively, such embodiments may lack one or more of the elements described below.

In the Figures, identical reference numbers identify identical or at least generally similar elements. To facilitate the discussion of any particular element, the most significant digit or digits of any reference number refer to the Figure in which that element is first introduced. Element 210, for example, is first introduced and discussed with reference to FIG. 2.

Figure 1:
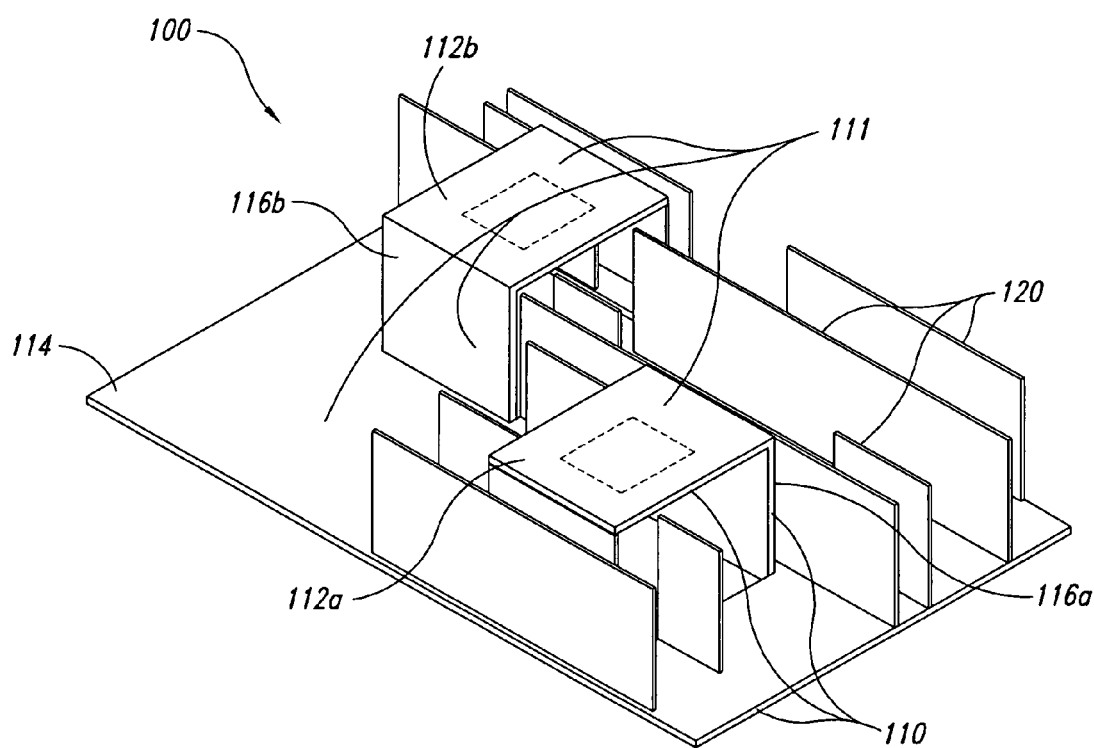
FIG. 1 is an isometric view of a heat sink configured in accordance with an embodiment of the invention.

FIG. 1 is an isometric view of a heat sink 100 configured in accordance with an embodiment of the invention. In one aspect of this embodiment, the heat sink 100 includes a heat pipe structure 110 and a plurality of cooling fins 120. In the illustrated embodiment, the heat pipe structure 110 includes a plurality of interface portions 112 (identified individually as a first interface portion 112a and a second interface portion 112b) offset from a body portion 114 by corresponding leg portions 116 (identified individually as a first leg portion 116a and a second leg portion 116b). The cooling fins 120 extend from the body portion 114 of the heat pipe structure 110.

In one embodiment, the heat pipe structure 110 can be formed from highly porous wick material 111 that is evacuated and contains a working fluid. For example, in one embodiment, the highly porous wick material can include a 3-D decahedral structure forming vacuum chambers that contain the working fluid. Such wick materials can include copper, aluminum and other suitable materials. In another embodiment, the heat pipe structure 110 or portions thereof can include materials that are similar to, or the same as, the "IsoSkin" (or "IsoFilm") material provided by, e.g., Novel Concepts, Inc. of Las Vegas, Nev., USA. In a further embodiment, the heat pipe structure 110 or portions thereof can include materials that are similar to, or the same as, the "Therma-Base™" vapor spreader material provided by Thermacore International, Inc. of Lancaster, Pa., USA. In another aspect of this embodiment, the working fluid can include water, acetone, ammonia, methanol, or other suitable fluid.

As used throughout this disclosure, the term "heat sink" will be understood to include devices and/or assemblies that serve to dissipate, carry away, or radiate heat generated by an active electronic device into the surrounding atmosphere. Further, the term "heat pipe structure" will be understood to include structures that contain one or more evacuated cavities, vessels or capillaries which are partially back-filled with a working fluid. Such structures can transfer heat by an evaporation/condensation cycle of the working fluid. As heat is absorbed from an electronic device or other heat source, the working fluid is vaporized, creating a pressure gradient in the heat pipe structure. The pressure gradient forces the vapor to flow outwardly from the heat source to a cooler region of the heat pipe structure where it condenses, giving up its latent heat of evaporation. The working fluid then cycles back to the evaporator portion of the heat pipe structure by capillary forces, gravity, and/or other means. Such processes can also be referred to as "thermosyphon" processes. One advantage of using a heat pipe structure to transfer heat in this manner is that such structures are typically very efficient and have high thermal conductance.

As described in greater detail below, in operation, the interface portions 112 of the heat sink 100 are positioned in contact with, or at least proximate to, electronic devices, such as computer processors, mounted on a computer module. Heat from the electronic devices is transferred to the interface portions 112, causing the working fluid in these regions to evaporate. The evaporated working fluid then moves away from the interface portions 112 to the body portion 114 via the leg portions 116. In the body portion 114, heat from the working fluid transfers into the cooling fins 120, causing the working fluid to condense and return to the interface portions 112 as part of a continual cycle.

Figure 2A:
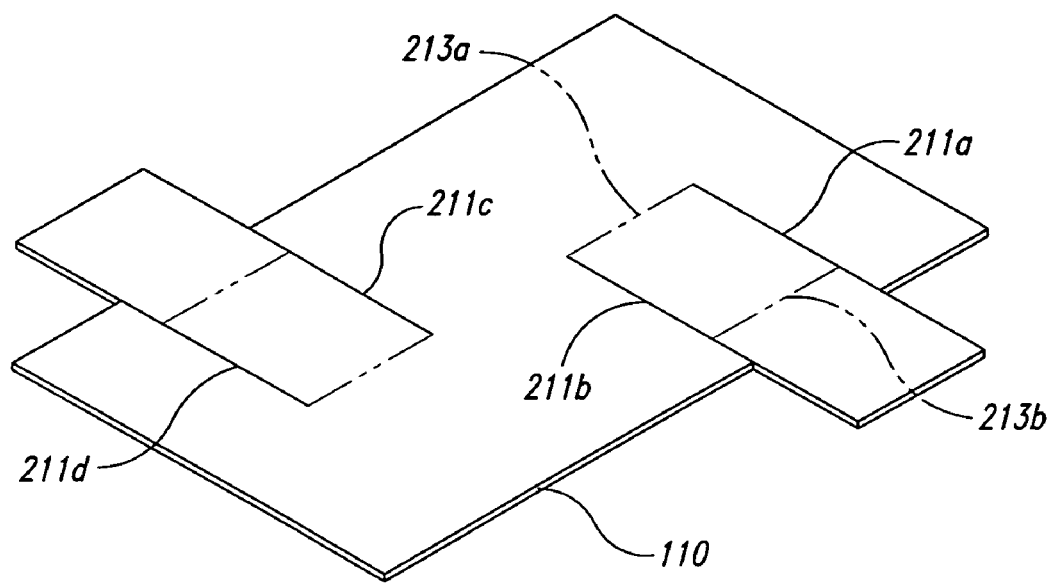
FIGS. 2A-2B illustrate a process for forming a heat pipe structure in accordance with an embodiment of the invention.
Figure 2B:
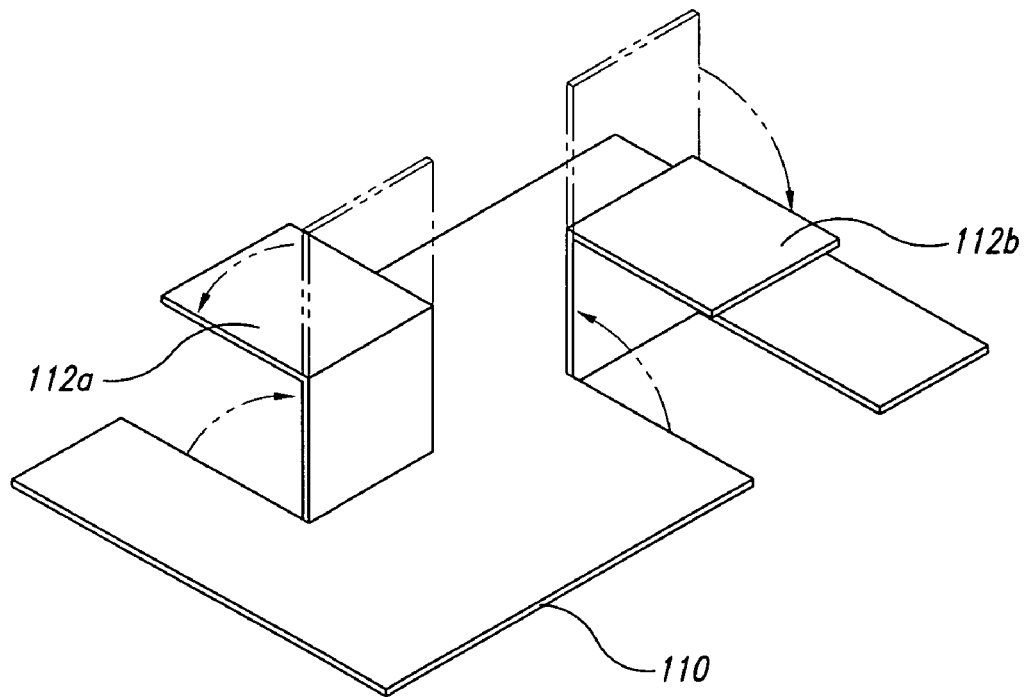

FIGS. 2A-2B illustrate one process for manufacturing the heat pipe structure 110 described above with reference to FIG. 1 in accordance with an embodiment of the invention. Referring first to FIG. 2A, the heat pipe structure 110 starts as a relatively planar piece of heat pipe material (e.g., porous wick material, IsoFilm, IsoSkin, Therma-Base™, or other suitable material that provides efficient heat transfer with relatively low thermal gradients). Four incisions are made along cut-lines 211a-211d. The two portions of material between the cut-lines 211a-b and 211c-d are then folded up about a first fold line 213a and then down about a second fold line 213b to form the interface portions 112 as illustrated in FIG. 2B. After this operation, the cooling fins 120 (FIG. 1) can be joined to the heat pipe structure 110 by solder bonding, adhesive bonding, or other suitable method. In other embodiments, the cooling fins 120 can be integrally formed with the heat pipe structure 110.

Figure 3:
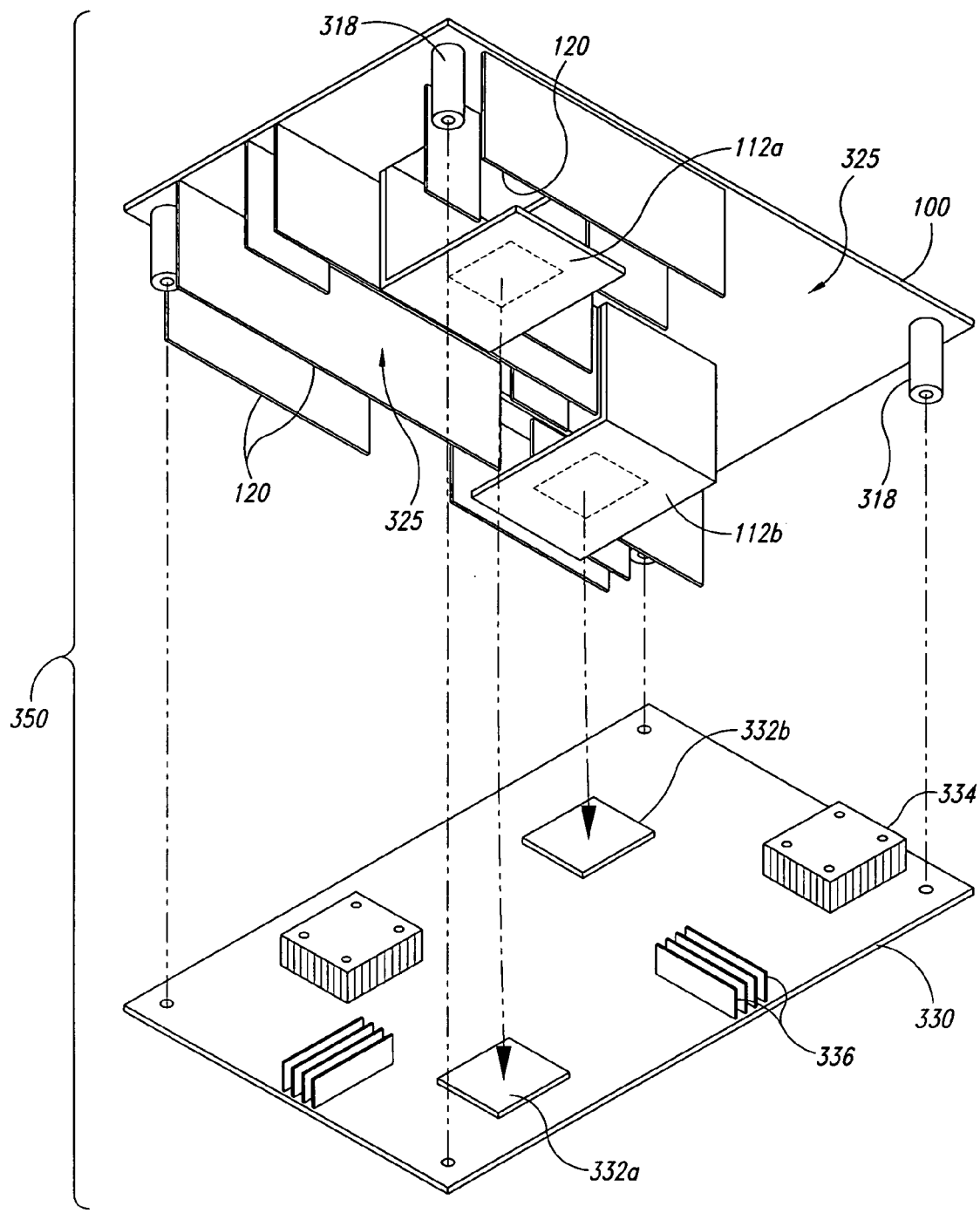
FIG. 3 is an exploded isometric view of a heat sink and a corresponding motherboard configured in accordance with an embodiment of the invention.

FIG. 3 is an exploded isometric view of a computer module assembly 350 configured in accordance with an embodiment of the invention. The computer module assembly 350 includes a motherboard 330 to which the heat sink 100 is mounted. The motherboard 330 includes a plurality of electronic devices, including memory devices 336, routing devices 334, and a plurality of processing devices 332 (illustrated as a first processing device 332a and a second processing device 332b).

In FIG. 3, the heat sink 100 is illustrated in an inverted position relative to FIG. 1. As shown, the heat sink 100 can include a plurality of risers 318 and/or other locating devices to position the interface portions 112 of the heat pipe structure 110 at least proximate to the corresponding processing devices 332 when the heat sink 100 is mounted to the motherboard 330. In one embodiment, the interface portions 112 can be held in contact with the corresponding processing devices 332 for efficient heat transfer. The cooling fins 120 can include a number of cutout areas 325 to provide adequate clearance for the various devices mounted to the motherboard 330. For example, the cooling fins 120 can include cutouts and/or other spatial accommodations for the memory devices 336 and the routing devices 334.

In one embodiment, the computer module 350 can be used in a computer cabinet for a supercomputer or other large computer system. Examples of such computer cabinets and related systems are disclosed in copending U.S. patent application Ser. Nos. 10/805,875, filed Mar. 22, 2004; Ser. No. 10/862,031, filed Jun. 4, 2004; and Ser. No. 10/886,911, filed Jul. 8, 2004. Each of these patent applications is incorporated herein in its entirety by reference. However, heat sinks configured in accordance with the present disclosure are not limited to use in such computer cabinets. In other embodiments, heat sinks configured in accordance with the present disclosure can be used for cooling other types of electronic devices in other types of computer systems and/or other types of electrical systems.

FIG. 4 is a cross-sectional elevation view of a portion of the computer module assembly 350 of FIG. 3, illustrating the heat sink 100 mounted to the motherboard 330. The interface portions 112 of the heat pipe structure 110 contact the corresponding processing devices 332. The cooling fins 120 extend downwardly from the body portion 114 of the heat sink 100 toward the motherboard 330. In operation, working fluid 440 proximate to the interface portion 112 absorbs heat from the processing device 332. The heat causes the working fluid 440 to evaporate. The increased pressure from the evaporation process drives the evaporated portion of the working fluid 440 away from the interface portion 112 and into the body portion 114 via the leg portion 116. The heated working fluid expands outwardly in the body portion 114, conducting heat to the cooling fins 120. The heat is dissipated by the cooling fins 120, causing the working fluid 440 to condense. The condensed working fluid 440 then recirculates back to the interface portion 112 through capillary action or otherwise in a continual cooling cycle.

Although, in one embodiment, the heat sink 100 can utilize a porous wick structure to cycle working fluid, in other embodiments, other systems and methods can be used for this purpose. For example, in various embodiments, heat sinks configured in accordance with the present disclosure can include a convection driven siphon 1013 (see FIG. 10), pumps (e.g., a reverse osmosis pump or a magnetic drive pump using water, a refrigerant, or other agent, etc.), and/or liquid metal nanofluid driven by an electromagnetic pump. Accordingly, the present invention is not limited to the use of porous wick structures, but extends to other suitable cooling technologies.

One feature of the heat sink 100 described above is that the cooling fins 120 are not constrained to the local area around the processing devices 332, but instead are able to expand into much of the open space around the motherboard 330. One advantage of this feature is that it can provide more efficient device cooling by taking advantage of higher velocity and/or lower temperature air flows near other parts of the computer module 350. Another advantage of this feature is that it increases the overall surface area of the cooling fins 120.

Figure 5:
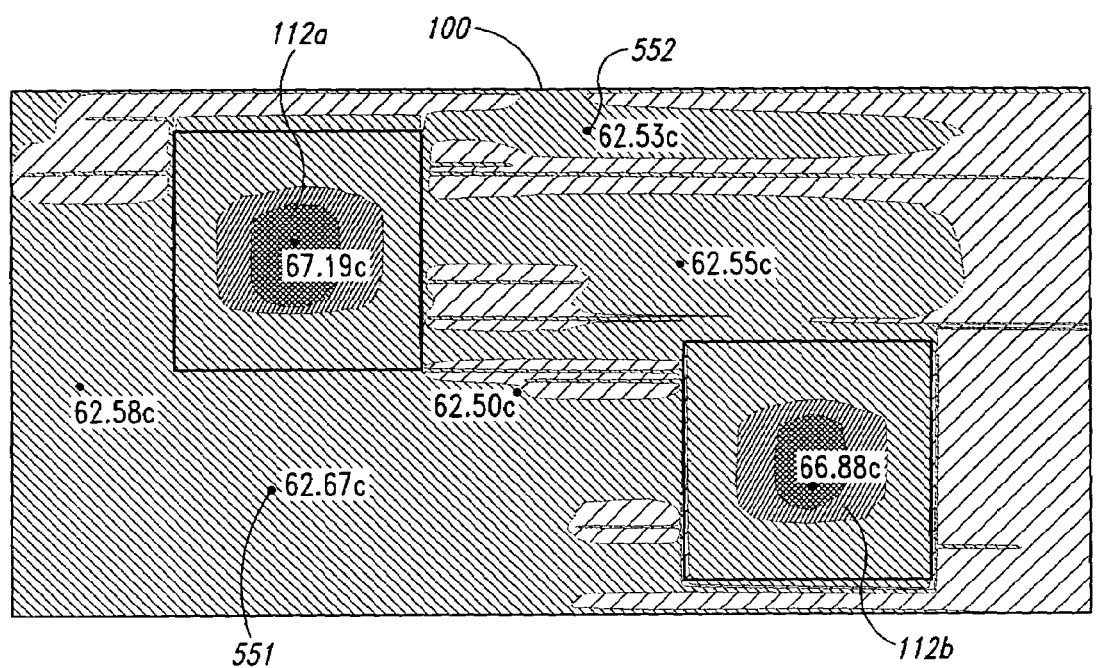
FIG. 5 is a schematic top view of a computer simulation illustrating temperature gradients in a heat sink configured in accordance with an embodiment of the invention.

FIG. 5 is a schematic top view illustrating temperature gradients across a computer model of the heat sink 100 in accordance with an embodiment of the invention. In this computer simulation, the temperature of the heat sink 100 proximate to the interface portions 112 is seen to be about 67° C. Moving outwardly from the interface portions 112, the heat is efficiently conducted to other regions of the heat sink 100 for dissipation via the cooling fins 120 (not shown). For example, the temperatures at a first point 551 and a second point 552 spaced apart from the interface portions 112 are about 63° C. The relatively small temperature gradient between the interface portions 112 and the first and second points 551, 552 illustrates the thermal efficiency of the heat sink 100 in the illustrated embodiment.

Figure 6:
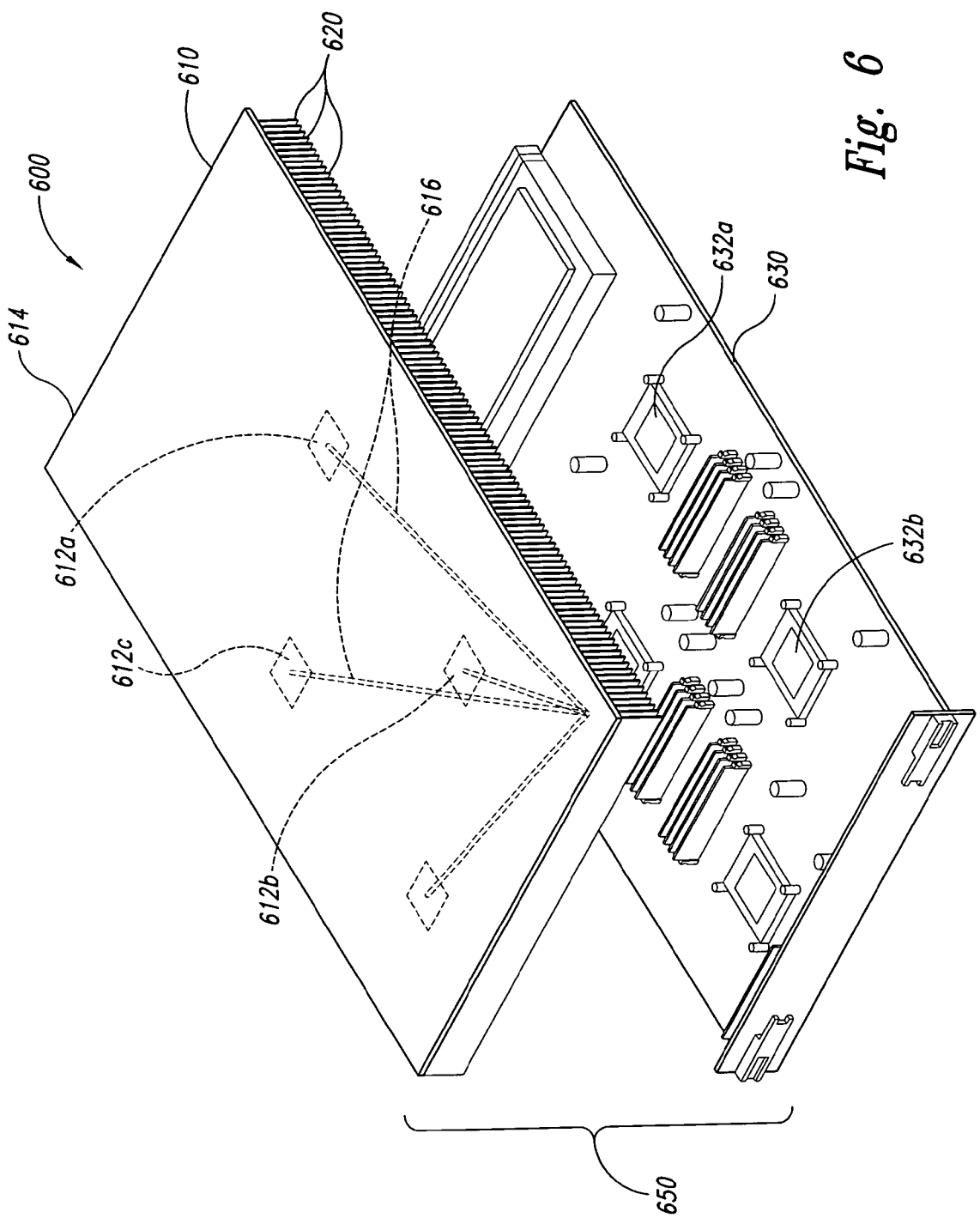
FIG. 6 is an exploded isometric view of a computer module assembly that includes a heat sink configured in accordance with another embodiment of the invention.

FIG. 6 is an exploded isometric view of a computer module assembly 650 that includes a motherboard 630 and a heat sink 600 configured in accordance with another embodiment of the invention. The motherboard 630 can be at least generally similar in structure and function to the motherboard 330 described above with reference to FIG. 3. Accordingly, the motherboard 630 can include a first processing device 632a and a second processing device 632b.

The heat sink 600 can include a plurality of cooling fins 620 extending downwardly from a heat pipe structure 610. In one aspect of this embodiment, the heat pipe structure 610 can include a plurality of evaporators 612 (identified individually as a first evaporator 612a, a second evaporator 612b, and a third evaporator 612c). In the illustrated embodiment, each of the evaporators 612 can include a microchannel heat exchanger (e.g., one or more heat pipes and/or vapor chambers) that absorbs heat from the corresponding processing device 632 and evaporates working fluid enclosed therein. The evaporated working fluid then flows outwardly away from the evaporators 612 via corresponding fluid paths 616. As it does so, the evaporated working fluid is disbursed throughout a body portion 614 of the heat pipe structure 610 (which may include additional microchannels and/or a cold plate) to condense the working fluid before returning to the evaporators 612.

Figure 7:
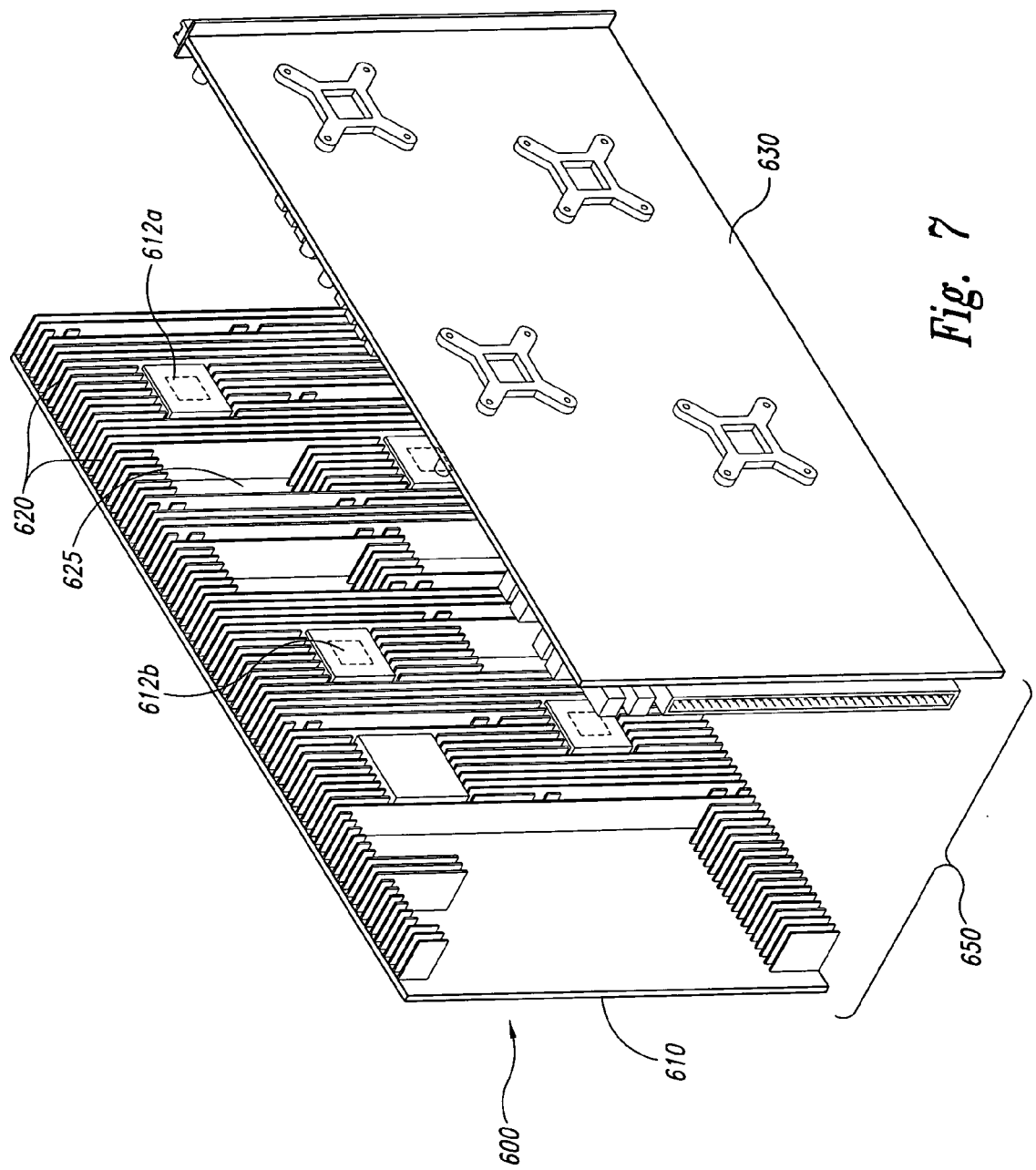
FIG. 7 is an exploded isometric view of the computer module assembly of FIG. 6 looking upwardly at a bottom portion of the heat sink.
Figure 8:
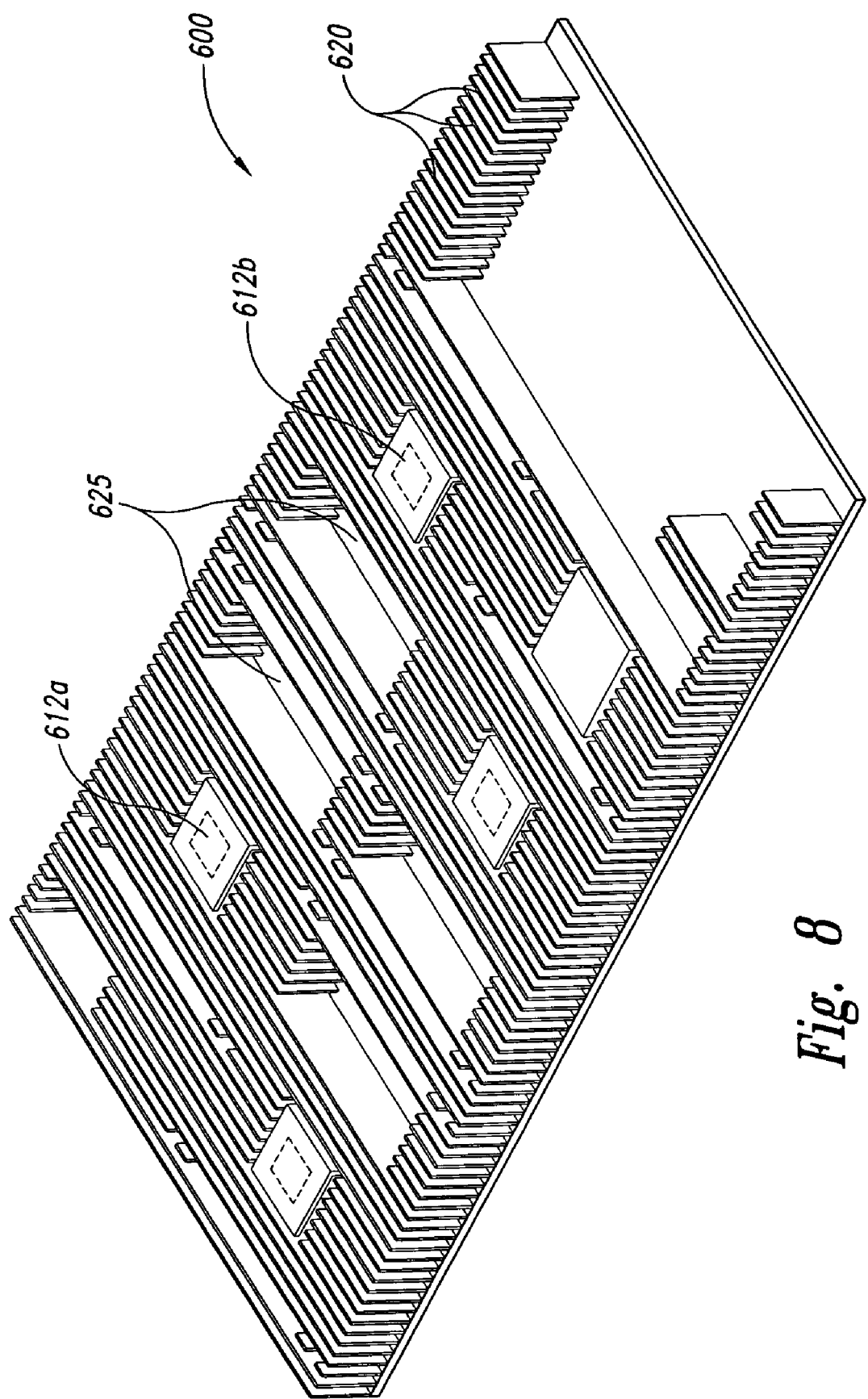
FIG. 8 illustrates cooling fin cutouts in the heat sink of FIGS. 7 and 8.

FIG. 7 is an exploded isometric view of the computer module assembly 650 of FIG. 6, looking upwardly at a bottom portion of the heat sink 600. The interface portions 612 of the heat pipe structure 610 extend downwardly from the body portion 614 toward the corresponding processing devices 632 (FIG. 6). The heat pipe structure 610 also includes a plurality of cutouts 625 formed in the cooling fins 620 to accommodate various devices mounted to the motherboard 630. The cutouts 625 and the interface portions 612 are further illustrated in FIG. 8.

Figure 9A:
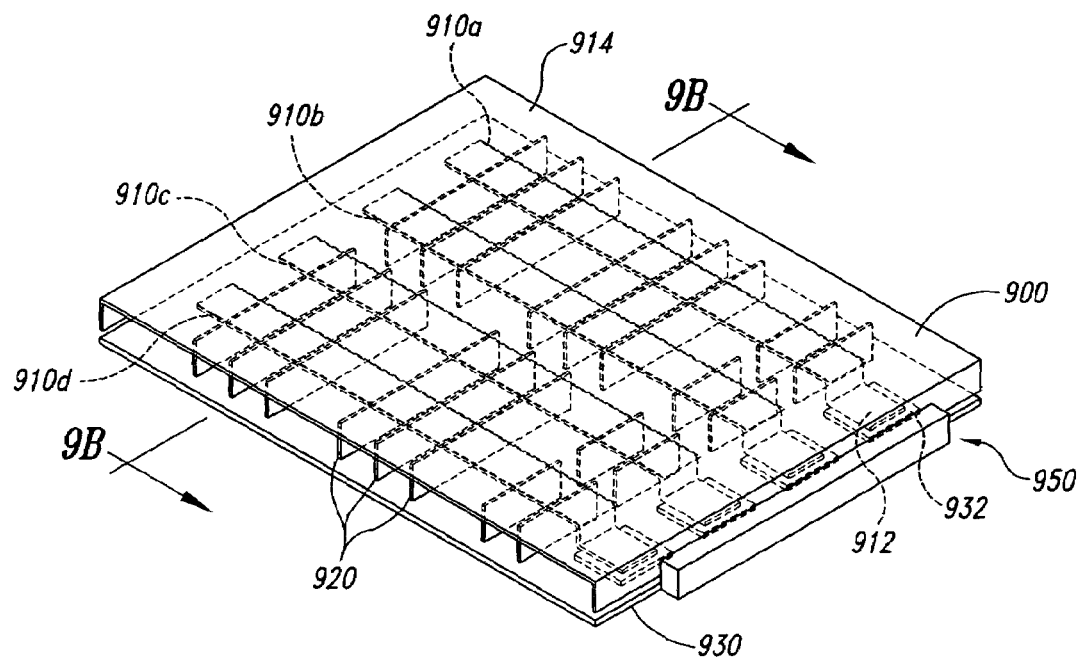
FIGS. 9A-9B are isometric and end views, respectively, of a computer module assembly having a heat sink configured in accordance with another embodiment of the invention.
Figure 9B:
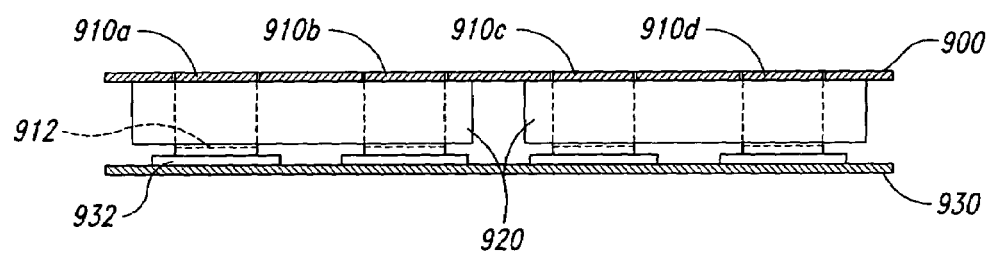

FIG. 9A is an isometric view of a computer module assembly 950 having a heat sink 900 configured in accordance with another embodiment of the invention. FIG. 9B is a cross-sectional end view taken along line 9B-9B in FIG. 9A. Referring to FIGS. 9A and 9B together, the heat sink 900 of this embodiment includes a plurality of individual heat pipe structures 910 (identified individually as heat pipe structures 910a-d) mounted to a body portion 914. A plurality of cooling fins 920 extend downwardly from the body portion 914 toward a motherboard 930, as shown in FIG. 9B. In the illustrated embodiment, the heat pipe structures 910 each include an interface portion 912 that contacts a corresponding processing device 932 mounted to the motherboard 930. The interface portions 912 of the heat pipe structures 910 joggle upwardly from the motherboard 930 and attach to the body portion 914 of the heat sink 900.

In operation, heat from the processing devices 932 is transferred into the interface portions 912 of the heat pipe structures 910. This heat causes working fluid (not shown) contained within the interface portions 912 to evaporate. The evaporated working fluid then flows away from the interface portions 912 and into those portions of the heat pipe structures 910 which are carried by the body portion 914 of the heat sink 900. The cooling fins 920 dissipate heat from the working fluid, causing the working fluid to condense and return to the interface portions 912.

From the foregoing, it will be appreciated that specific embodiments of the invention have been described herein for purposes of illustration, but that various modifications may be made without deviating from the spirit and scope of the invention. For example, although many of the heat sinks described above include closed heat pipe systems that passively circulate working fluids, other embodiments of the invention can include active systems for circulating working fluid. For example, in one embodiment, a pump can be used to circulate working fluid from an external source though a heat sink assembly similar to those described above.

Furthermore, aspects of the invention described above in the context of particular embodiments may be combined or eliminated in other embodiments. In addition, while advantages associated with certain embodiments of the invention have been described in the context of those embodiments, other embodiments may also exhibit such advantages, and not all embodiments need necessarily exhibit such advantages to fall within the scope of the invention. Accordingly, the invention is not limited, except as by the appended claims.

I claim:

1. A heat sink for dissipating heat generated by an electronic device in a computer system, the heat sink comprising:
    a heat pipe structure formed from a single piece of heat pipe material having a plurality of evacuated passages, the heat pipe structure including:
        a planar interface portion configured to be positioned proximate to the electronic device;
        a planar leg portion extending away from the interface portion, wherein the leg portion is at least generally perpendicular to the interface portion, and wherein the interface portion extends away from the leg portion in a first direction;
        a planar body portion vertically offset from the interface portion by the leg portion, wherein the body portion is at least generally parallel to the interface portion, and wherein the body portion includes a first portion of the evacuated passages which extends away from the leg portion in the first direction and a second portion of the evacuated passages which extend away from the leg portion in a second direction, the second direction being opposite to the first direction; and
        a working fluid that cycles through the evacuated passages of the heat pipe material to absorb heat from the electronic device at the interface portion of the heat pipe structure and transfer the heat to the body portion of the heat pipe structure.

2. The heat sink of claim 1, further comprising at least one cooling fin attached to the body portion of the heat pipe structure.

3. The heat sink of claim 1, further comprising a plurality of coplanar cooling fins attached to the body portion of the heat pipe structure.

4. The heat sink of claim 1, further comprising at least one cooling fin attached to the body portion of the heat pipe structure, wherein the body portion of the heat pipe structure is vertically offset from the interface portion in a third direction, and wherein the at least one cooling fin extends away from the body portion in a fourth direction, opposite to the third direction.

5. The heat sink of claim 1 wherein the heat pipe structure further includes at least one internal passage extending from the interface portion to the body portion, and wherein at least a portion of the working fluid is contained in the internal passage.

6. The heat sink of claim 1 wherein the heat pipe structure includes a plurality of capillaries through which the working fluid circulates.

7. A heat sink for dissipating heat generated by an electronic device in a computer system, the heat sink comprising:
    a heat pipe structure, the heat pipe structure including:
        an interface portion configured to be positioned proximate to the electronic device;
        a leg portion extending away from the interface portion, wherein the leg portion is at least generally perpendicular to the interface portion, and wherein the interface portion extends away from the leg portion in a first direction;
        a body portion vertically offset from the interface portion by the leg portion, wherein the body portion is, wherein the body portion has a planar surface that is at least generally parallel to the interface portion and substantially larger than the interface portion, and wherein the planar surface extends away from the leg portion in the first direction and a second direction, the second direction being opposite to the first direction; and
        a working fluid positioned to absorb heat from the electronic device at the interface portion of the heat pipe structure and transfer the heat to the body portion of the heat pipe structure, wherein the heat pipe structure includes a thermosyphon that carries at least a portion of the working fluid through a plurality of fluid passages in the body portion that extend away from the leg portion in the first direction and the second direction.

8. The heat sink of claim 1 wherein the heat pipe structure includes a porous wick structure that carries at least a portion of the working fluid.

9. The heat sink of claim 1 wherein the heat pipe structure includes a convection driven siphon that carries at least a portion of the working fluid.

10. The heat sink of claim 1 wherein the interface portion of the heat pipe structure is a generally planar structure.

11. The heat sink of claim 1 wherein interface portion and the body portion of the heat pipe structure are generally coplanar structures.

12. A heat sink for dissipating heat generated by an electronic device in a computer system, the heat sink comprising:

a heat pipe structure, the heat pipe structure including:
a first interface portion configured to be positioned proximate to a first electronic device, wherein the first interface portion is formed from heat pipe material having a plurality of evacuated passages;
a body portion offset from the first interface portion by a first leg portion, wherein the body portion is configured to be spaced apart from the first electronic device, and wherein the body portion and the first leg portion are formed from the same heat pipe material as the first interface portion;
a working fluid that cycles through the evacuated passages of the heat pipe material to absorb heat from the first electronic device at the first interface portion of the heat pipe structure and transfer the heat to the body portion of the heat pipe structure; and
a second interface portion offset from the body portion by a second leg portion, wherein the second interface portion is configured to be positioned proximate to a second electronic device.

13. A computer module assembly comprising:
a motherboard;
an electronic device mounted to the motherboard; and
a heat sink configured to dissipate heat generated by the electronic device, the heat sink including a heat pipe structure having:
  an interface portion positioned proximate to the electronic device, wherein the interface portion is formed from heat pipe material having a plurality of evacuated passages;
  a leg portion extending away from the interface portion, wherein the leg portion is at least generally perpendicular to the interface portion, and wherein the interface portion extends away from the leg portion in a first direction;
  a body portion offset from the interface portion by the leg portion, wherein the body portion is spaced apart from the electronic device, wherein the body portion and the leg portion are formed from the same heat pipe material as the interface portion, and wherein the body portion includes a first portion of the evacuated passages that extends away from the leg portion in the first direction and a second portion of the evacuated passages that extend away from the leg portion in a second direction, the second direction being opposite to the first direction; and
  a working fluid that cycles through the evacuated passages in the heat pipe material to absorb heat from the electronic device and transfer the heat to the body portion of the heat pipe structure.

14. The computer module assembly of claim 13, wherein the heat pipe structure further includes a plurality of cooling fins extending away from the body portion toward the mother board.

15. A computer module assembly comprising:
a motherboard;
a first electronic device mounted to the motherboard;
a heat sink configured to dissipate heat generated by the first electronic device, the heat sink including a heat pipe structure having:
  a first interface portion positioned proximate to the first electronic device, wherein the first interface portion is formed from heat pipe material having a plurality of evacuated passages;
  a body portion offset from the first interface portion by a leg portion, wherein the body portion is spaced apart from the first electronic device, and wherein the body portion and the leg portion are formed from the same heat pipe material as the first interface portion; and
  a working fluid that cycles through the evacuated passages in the heat pipe material to absorb heat from the first electronic device and transfer the heat to the body portion of the heat pipe structure, and
a second electronic device mounted to the motherboard, wherein the heat pipe structure further includes a second interface portion spaced apart from the first interface portion and positioned proximate to the second electronic device.

16. A computer module assembly comprising:
a motherboard;
a first electronic device mounted to the motherboard;
a second electronic device mounted to the motherboard;
a heat sink configured to dissipate heat generated by the first electronic device, the heat sink including a heat pipe structure having:
  a first interface portion positioned proximate to the first electronic device;a body portion offset from the first interface portion by a leg portion, wherein the body portion is spaced apart from the first electronic device;
  a working fluid positioned to absorb heat from the first electronic device and transfer the heat to the body portion of the heat pipe structure;
  a second interface portion spaced apart from the first interface portion and positioned proximate to the second electronic device; and
  a plurality of cooling fins extending from the body portion toward the mother board between the first and second interface portions.

17. A system for dissipating heat generated by an electronic device mounted to a motherboard, the system comprising:
  means for transferring heat from the electronic device into a working fluid to thereby cause at least a portion of the working fluid to evaporate;
  means for conveying at least a portion of the evaporated working fluid away from the motherboard in a first direction; and
  means for transferring heat from the evaporated working fluid into a plurality of cooling fins extending toward the motherboard in a second direction opposite to the first direction, wherein the plurality of cooling fins include a first portion of cooling fins spaced apart from a second portion of cooling fins, wherein the first portion of cooling fins is offset from a first side of the means for conveying and the second portion of cooling fins is offset from a second side of the means for conveying, and wherein transferring heat from the evaporated working fluid into the plurality of cooling fins causes at least a portion of the evaporated working fluid to condense.

18. The system of claim 17 wherein the means for conveying at least a portion of the evaporated working fluid away from the motherboard include a plurality of capillaries.

19. The system of claim 17, further comprising means for returning at least a portion of the condensed working fluid to a position proximate the electronic device.

20. The system of claim 19 wherein the means for returning include a porous wick structure.

21. A method for cooling an electronic device in a computer system, the method comprising:
  forming an interface portion, a leg portion, and a body portion of a heat sink from a single piece of heat pipe material having a plurality of evacuated passages;

positioning the interface portion of the heat sink at least proximate to a surface of the electronic device, wherein the interface portion of the heat sink is vertically offset from the body portion of the heat sink by the leg portion, wherein the interface portion extends away from the leg portion in a first direction, and wherein the body portion includes a first portion of the evacuated passages that extends away from the leg portion in the first direction and a second portion of the evacuated passages that extend away from the leg portion in a second direction, the second direction being opposite to the first direction, and wherein the heat sink further includes a working fluid positioned to absorb heat from the electronic device and transfer the heat to the body portion of the heat sink via the first and second portions of the evacuated passages; and moving air past a plurality of cooling fins extending from the body portion of the heat sink.

22. The method of claim 21 wherein positioning an interface portion of a heat sink at least proximate to a surface of the electronic device includes positioning the interface portion of the heat sink in contact with the surface of the electronic device.

23. The method of claim 21 wherein the body portion of the heat sink is vertically offset from the interface portion of the heat sink in a third direction, and wherein moving air past the plurality of cooling fins includes moving air past a plurality of cooling fins extending away from the body portion of the heat sink in a fourth direction opposite to the first direction.

* * * * *

UNITED STATES PATENT AND TRADEMARK OFFICE
CERTIFICATE OF CORRECTION

| | | |
|---|---|---|
| PATENT NO. | : 7,304,842 B2 | Page 1 of 1 |
| APPLICATION NO. | : 11/153847 | |
| DATED | : December 4, 2007 | |
| INVENTOR(S) | : Yatskov | |

It is certified that error appears in the above-identified patent and that said Letters Patent is hereby corrected as shown below:

On page 2, under "Other Publications", in column 2, line 25, delete "http:/" and insert -- http:// --, therefor.

In column 10, line 21, in Claim 16, delete "device;a" and insert -- device; a --, therefor.

Signed and Sealed this

First Day of July, 2008

JON W. DUDAS
*Director of the United States Patent and Trademark Office*